US009064583B2

(12) United States Patent
Roy et al.

(10) Patent No.: US 9,064,583 B2
(45) Date of Patent: Jun. 23, 2015

(54) FAST ACCESS WITH LOW LEAKAGE AND LOW POWER TECHNIQUE FOR READ ONLY MEMORY DEVICES

(71) Applicant: LSI Corporation, San Jose, CA (US)

(72) Inventors: Rajiv Kumar Roy, Bangalore (IN); Disha Singh, Bangalore (IN); Sahilpreet Singh, Bangalore (IN)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 7 days.

(21) Appl. No.: 13/775,942

(22) Filed: Feb. 25, 2013

(65) Prior Publication Data
US 2014/0241061 A1 Aug. 28, 2014

(51) Int. Cl.
G11C 11/34 (2006.01)
G11C 17/12 (2006.01)

(52) U.S. Cl.
CPC ..................... G11C 17/12 (2013.01)

(58) Field of Classification Search
CPC ....................................................... G11C 17/12
USPC .................... 365/185.16, 104, 227
See application file for complete search history.

(56) References Cited

U.S. PATENT DOCUMENTS

| 5,315,541 | A | * | 5/1994 | Harari et al. | 365/185.13 |
| 5,467,300 | A | * | 11/1995 | Komarek et al. | 365/185.16 |
| 6,292,395 | B1 | * | 9/2001 | Lin | 365/185.2 |
| 6,765,817 | B2 | * | 7/2004 | Takemura | 365/154 |
| 6,853,572 | B1 | * | 2/2005 | Sabharwal | 365/63 |
| 6,980,456 | B2 | * | 12/2005 | Chen et al. | 365/104 |
| 7,035,129 | B1 | * | 4/2006 | Khanuja | 365/63 |
| 7,099,230 | B1 | * | 8/2006 | Tran | 365/230.03 |
| 7,301,819 | B2 | * | 11/2007 | Khanuja | 365/185.25 |
| 7,436,690 | B2 | * | 10/2008 | Chen | 365/104 |
| 7,729,155 | B2 | * | 6/2010 | Luthra | 365/94 |
| 7,940,546 | B2 | * | 5/2011 | Thyagarajan et al. | 365/104 |
| 8,031,542 | B2 | * | 10/2011 | Sachan et al. | 365/196 |

* cited by examiner

Primary Examiner — Viet Q Nguyen
(74) Attorney, Agent, or Firm — Sheridan Ross P.C.

(57) ABSTRACT

A Read Only Memory (ROM) and method for providing a high operational speed with reduced leakage, no core cell standby leakage, and low power consumption. The source of the ROM cell (NMOS) is connected to a virtual ground line (VNGD) instead of VSS. Thus, the ROM cell can be operatively coupled to the bit-line, the word-line, and the virtual ground, which also acts as a column select signal. The arrangement of the ROM is such that the virtual ground of the selected column is pulled down to a ground voltage. Non-selected columns virtual ground can be maintained at a supply voltage to ensure that unwanted columns will not have any sub-threshold current (as Vds=0). Since no pre-charging of bit-line comes in the access time path, the ROM achieves a high operational speed with reduced leakage and low power consumption.

20 Claims, 3 Drawing Sheets

FAST ACCESS WITH LOW LEAKAGE AND LOW POWER TECHNIQUE FOR READ ONLY MEMORY DEVICES

FIELD OF THE INVENTION

Embodiments are generally related to memory devices and components. Embodiments also relate to ROM (Read Only Memory) devices and more particularly to ROMS having high operational speeds with reduced leakage and lower power consumption.

BACKGROUND

Semiconductor memory devices have undergone various design changes in terms of package density, operating speed, or power/current dissipation. Many devices, such as microprocessors, or other related devices include onboard memory components, which may contain one or more read only memory (ROM) cells.

ROM circuits are generally composed of memory elements disposed in rows and columns. Energizing the word-line corresponding to the desired word and also energizing the column corresponding to the addressed word generally address a particular word in a memory. There are schemes that can reduce static leakage and dynamic power consumption of the bit-line, for example, selectively pre-charging the bit-lines of a selected column.

FIG. 1, for example, illustrates a schematic diagram of a prior art "classical" NOR memory cell core 200. Cell core 200 demonstrates some of the problems with prior art architectures. Depending on the specifications, such prior art ROM configurations can offer high speed and high areas (e.g., NAND memory cell or special NOR memory cells), and may also offer low leakage, zero leakage, and low speeds. Some prior art configurations may also offer a medium area, a low speed, and low leakage. Such schemes, however, do not offer medium area, high speed, and low leakage (the disclosed embodiments do offer these features). The "classical" NOR memory cell core 200 configuration shown in FIG. 1 includes an arrangement in which WL <0, 1, 2, 3> are the word-lines and BL <0> is the column bit-line selected for the READ operation. A GND line can also be included with respect to the cell core 200. In general, no discharge takes place if, for example, WL 1 is selected. An accompanying timing diagram 20 is also shown in FIG. 1. The dashed area 28 shown in FIG. 1 indicates an overlapping of respective selected bit line pre-charge and word-lines 24 and 22. The scheme of circuit 200 shown in FIG. 1 suffers, however, from the problem of high dynamic power and high penalty on speed as the pre-charge is accomplished in the access time period, which overlaps with the word-line selection.

A need exists for ROMs that improve operational speeds while providing power and leakage benefits. As will be seen shortly, the disclosed embodiments can reduce leakage and power dissipation which offer continued high performance.

SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide improved memory devices and components.

It is another aspect of the disclosed embodiments to provided improved ROM devices and more particularly to ROM devices having high operational speeds with reduced leakage and lower power consumption.

The aforementioned aspects and other objectives and advantages can now be achieved as described herein. A read only memory (ROM) and method thereof are disclosed having a high operational speed with reduced leakage, no core cell standby leakage and low power consumption. Such a ROM generally includes one or more bit lines, one or more word lines, and one or more virtual grounds. Additionally such a ROM includes one or more ROM cells, wherein each ROM cell includes a source operatively coupled to the bit line(s), the word line(s), and the virtual ground such that the virtual ground(s) is pulled down to a ground voltage and with respect to non-selected columns, and virtual ground(s) is maintained at a supply voltage to ensure that unwanted columns do not offer sub-threshold currents. The virtual ground (s) additionally can function as a column select signal. The ROM cell can be, for example, a NMOS transistor.

Such an improved ROM offers a high operational speed with reduced leakage, no core cell standby leakage, and low power consumption. In the proposed invention, the source of the ROM cell (NMOS) is connected to virtual ground line (VGND) instead of VSS. Thus, the ROM cell is operatively coupled to the bit-line, the word-line, and the virtual ground, which also acts as a column select signal. The arrangement of the ROM is such that the virtual ground of the selected column is pulled down to a ground voltage GND. The non-selected columns virtual ground can be maintained at a supply voltage VDD to ensure that unwanted columns will not have any sub-threshold current (i.e., as Vds=0). Since no pre-charging of bit-line comes in the access time path, the ROM can achieve a high operational speed with reduced leakage and low power consumption.

BRIEF DESCRIPTION OF THE FIGURES

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
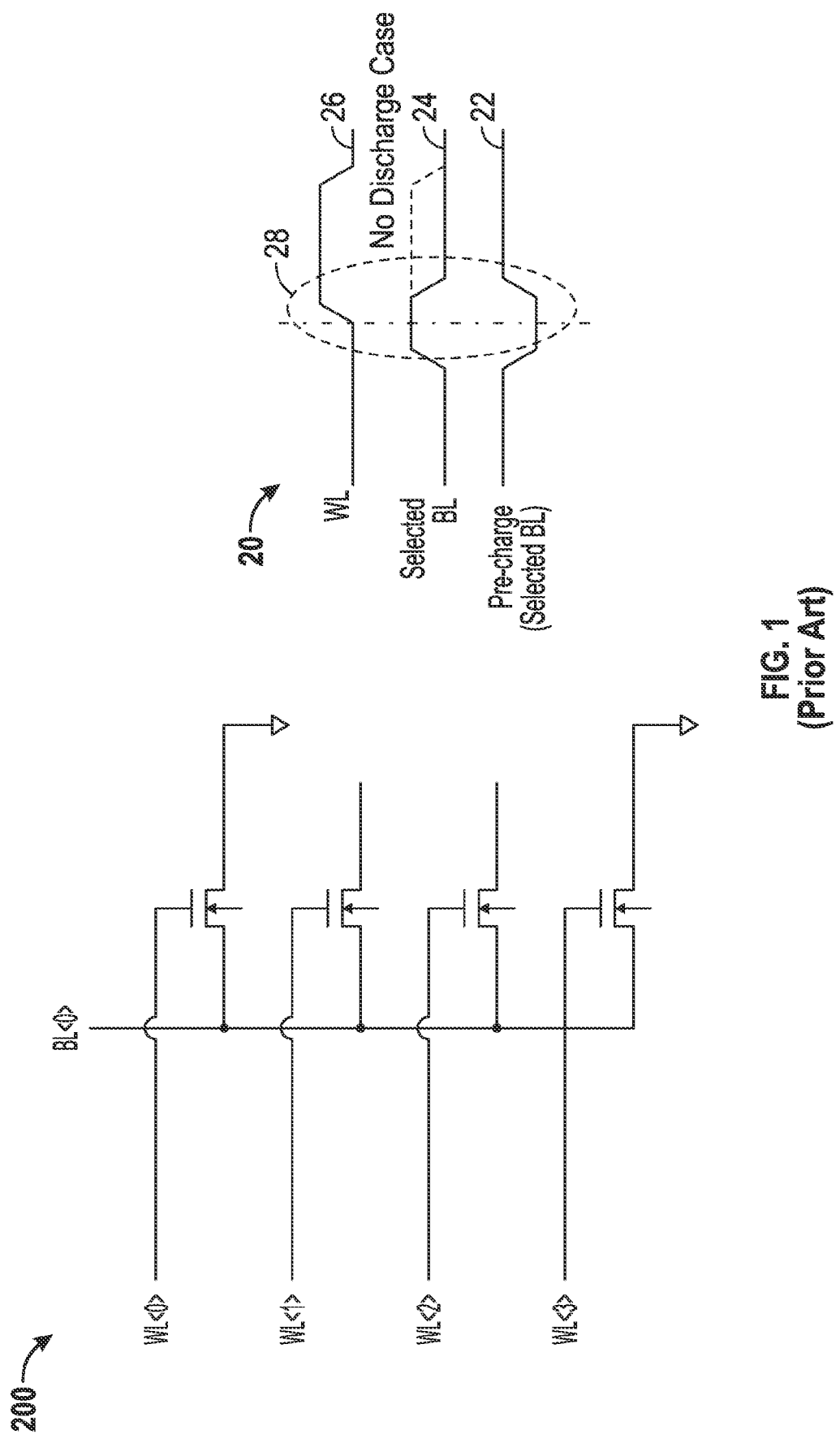
FIG. 1 illustrates a schematic diagram of a prior art circuit for reducing static leakages and dynamic power consumption.

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Thus, for example, although different embodiments are described with respect to different features and components and varying figures, each figure can relate to the prior figure or next figure as part of an overall description of the present invention. Similarly, similar or identical parts or components may be indicated by the same reference numeral or identifier in different figures.

The embodiments described herein generally relate to a high speed with low power and low leakage scheme that employs a ROM cell that is operatively coupled to the bit-line, the word-line, and the virtual ground instead of GND (ground) which also acts as a column select signal. The arrangement of the ROM is such that the virtual ground of the selected column is pulled down to a ground voltage GND. Non-selected columns virtual ground can be maintained at a supply voltage VDD to ensure that unwanted columns will not include any sub-threshold current (as Vds=0). During a standby period, the VGND (virtual ground) and the BLs are pre-charged to "1" so there is practically no BL leakage at all. Since no pre-charging of bit-line comes in the access time path, the disclosed ROM achieves a high operational speed with reduced leakage and low power consumption.

Such an approach therefore offers a high speed ROM with low leakage and low dynamic power. Additionally, no tracking circuitry is required as opposed to bit-line pre-charge tracking circuitry, thus such a design is area efficient and no performance penalty exists due to extra margins. The disclosed embodiments also offering the possibility of utilizing adjacent bit-line(s) for using an unbalanced sense amplifier.

With the disclosed embodiments, bit-lines can be pre-charged to VDD in the default case. The virtual ground, which runs per column, can be pre-charged until VDD is attained. Thus, when no read operation is being performed, the sub-threshold leakage through the ROM cell is negligible as VDS=0. With the rising edge of clock, the selected virtual ground can be pulled to GND from VDD. Since the virtual ground line is pulled down from VDD to GND using NMOS which does not require a tracking path as such (i.e., gets automatically tracked through a "dummy" bit-line which also has its virtual ground pre-charged to VDD and pulled down same as actual bit-line), such a configuration is much faster than pre-charging bit-lines to VDD using PMOS. With the arrival of word-line, bit-line stays at VDD or discharges as per the data stored in memory cell. For the non-accessed columns, since virtual ground is at VDD, no bit-line discharges. Such an approach provides rapid access with reduced leakage and power consumption.

Figure 2:
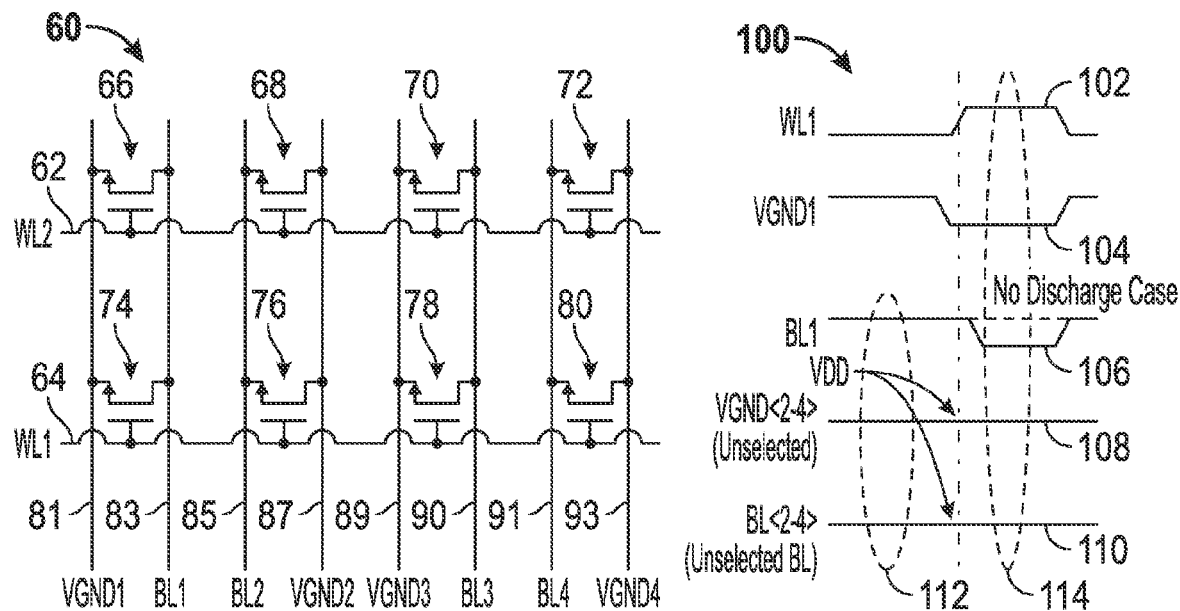
FIG. 2 illustrates a schematic diagram of a circuit for high performance with low power and low leakage, in accordance with a preferred embodiment.

FIG. 2 illustrates a schematic diagram of a circuit 60 for high performance with low power and low leakage, in accordance with a preferred embodiment. Circuit 60 provides for a ROM cell configuration that includes a bit-line (e.g., bit-lines 83, 85, 90, 91 also respectively labeled BL1, BL2, BL3, BL4) and a word-line (e.g., word-lines 62, 64, also respectively labeled WL2, WL1), and a select-cum-discharge signal VGND (i.e., VGND 81, 87, 89, 93, also respectively labeled VGND1, VGND2, VGND3, VGND 4). Thus, circuit 60 provides for an array of memory with a plurality of word-lines, a plurality of bit-lines, and a plurality of virtual ground VGND connections. VGND lines/connections 81, 87, 89, 93 can act both as column select lines while providing a discharge path. Since only 1 ROM cell per column discharges, the level of VGND remains at GND Clock diagram 100 shown in FIG. 2 demonstrates sample operations corresponding to circuit 60. Clock signals 102, 104, 106, 108, and 110 shown in the clock diagram 100 correspond respectively to WL1, VGND1, BL1, VGND <2-4> (Unselected), and BL <2-4> (Unselected BL). The dashed area 112 shown in FIG. 2 indicate no leakage as Vds is zero. The dashed area 114 shown in FIG. 2 indicates no power loss and that the bit-line pre-charge and word-line do not overlap. Thus, the VGND level remains at GND as only one memory cell discharges through it.

Depending on the column that has been selected, the corresponding GND can be pulled down to zero at the arrival of clock. The NMOS device used to bring VGND low can be made sufficiently large so that the VGND acts as virtual ground. There is no requirement of VGND to be brought to "0" before word-line is turned ON. Thus, the word-line need not be delayed as in other low leakage ROM architecture. Thus a much faster low leakage ROM is achieved with the proposal. The remainder of the column selects VGND lines can be connected to VDD, so that the bit-lines in other columns (i.e., not intended to be read) will not discharge. This provides a selective reading of column since memory in those columns have Vds=0.

Adjacent bit-line can be used as inputs to an unbalanced latch type sense amplifier. However, a switch has to be used to route the selected bit-line to the drain of the weaker NMOS. This makes the unbalanced sense amplifier more noise immune as none of the two nodes of sense amplifier are tied to the supply voltage VDD. Use of adjacent bit-line for unbalanced sense amplifier is not possible in the case of the prior configuration shown in FIG. 1.

Note that since in the non-accessed case the Vds across the ROM cell is "0", no sub-threshold leakage takes place achieving low leakage. Also since the bit-line are not pre-charged in the access cycle, and that no overlapping of pre-charge and word-line selection takes place, low power consumption can be achieved.

Figure 3:
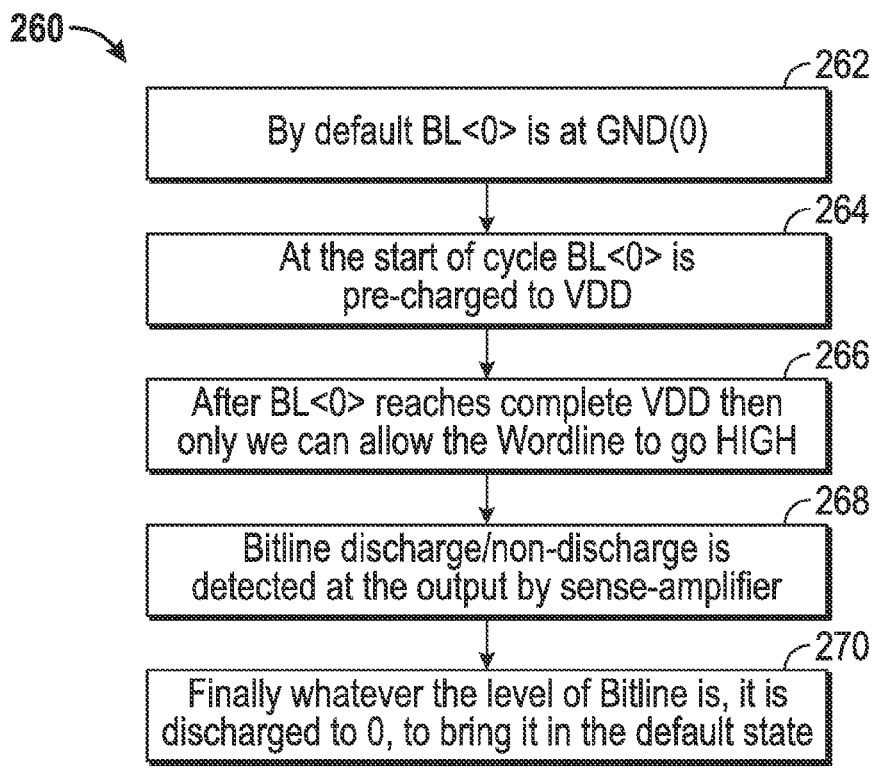
FIG. 3 illustrates a flow chart of operations illustrating logical operational steps of a prior art method associated with low speed and low leakage ROM architecture.

FIG. 3 illustrates a flow chart of operations illustrating logical operational steps of a prior art method 260 associated with a medium area, low speed, and low leakage ROM architecture. As shown at block 262, an operation can be implemented in which by default BL <0> is at GND (0). There is 0 leakage during this phase or operation. As indicated next at block 264, at the start of the cycle BL <0> is pre-charged to VDD. Then, as illustrated at block 266, after BL <0> reaches complete VDD, only then is the word-line allowed to go HIGH. Note that with such a prior art configuration, a tracking circuit is likely required to track the pre-charging or circuit failure could occur. A penalty of around 30% (CK to WL timing) therefore is present with respect to the total access time. The "dummy" block for tracking is also a major area of loss. This is a significant problem with such prior art schemes.

Following implementation of the operation depicted at block 266, the bit-line discharge/non-discharge can be detected at the output via, for example, a sense amplifier. Finally, as described at block 270, whatever the level bit-line is, it is discharged to 0 to bring it to the default state.

Figure 4:
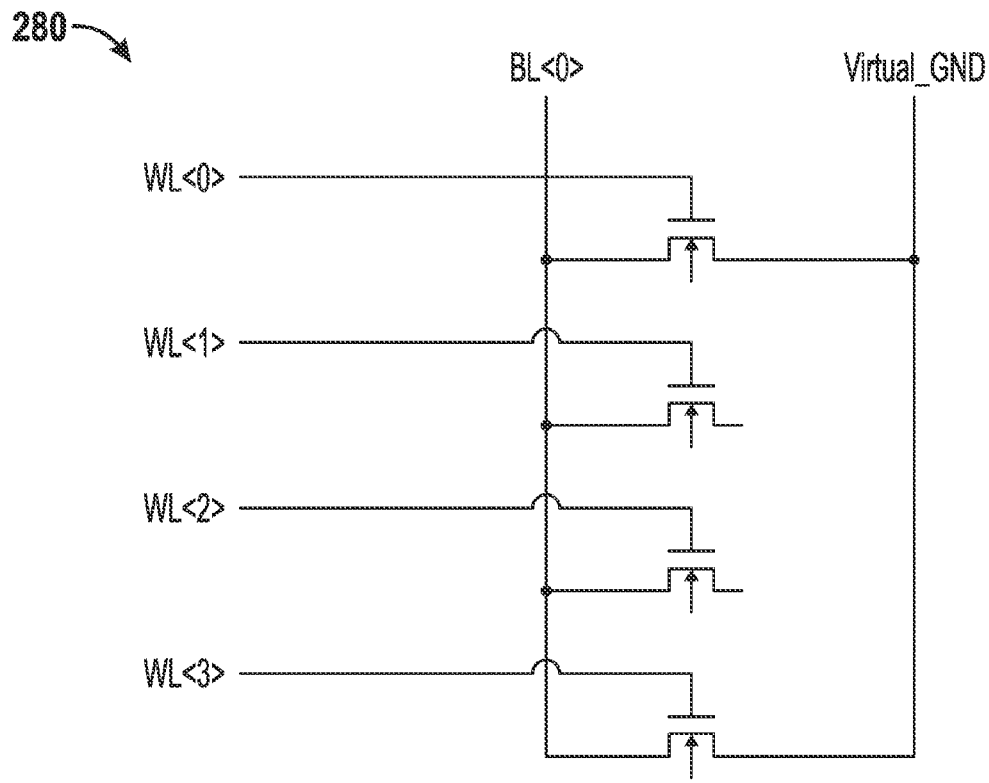
FIG. 4 illustrates a schematic diagram of a circuit that includes a NOR memory cell core incorporating a virtual ground arrangement, in accordance with an alternative embodiment.

FIG. 4 illustrates a schematic diagram of a circuit 280 that includes a NOR memcell core incorporating a virtual GND arrangement, in accordance with an alternative embodiment. In the arrangement of circuit 280 shown in FIG. 4, WL <0, 1, 2, 3> are the word-lines. BL <0> is the column bit-line selected for a READ operation. A virtual_GND (virtual ground) is also shown in circuit 280. By default, the virtual_GND will be at VDD to eradicate any leakage during the default state.

Figure 5:
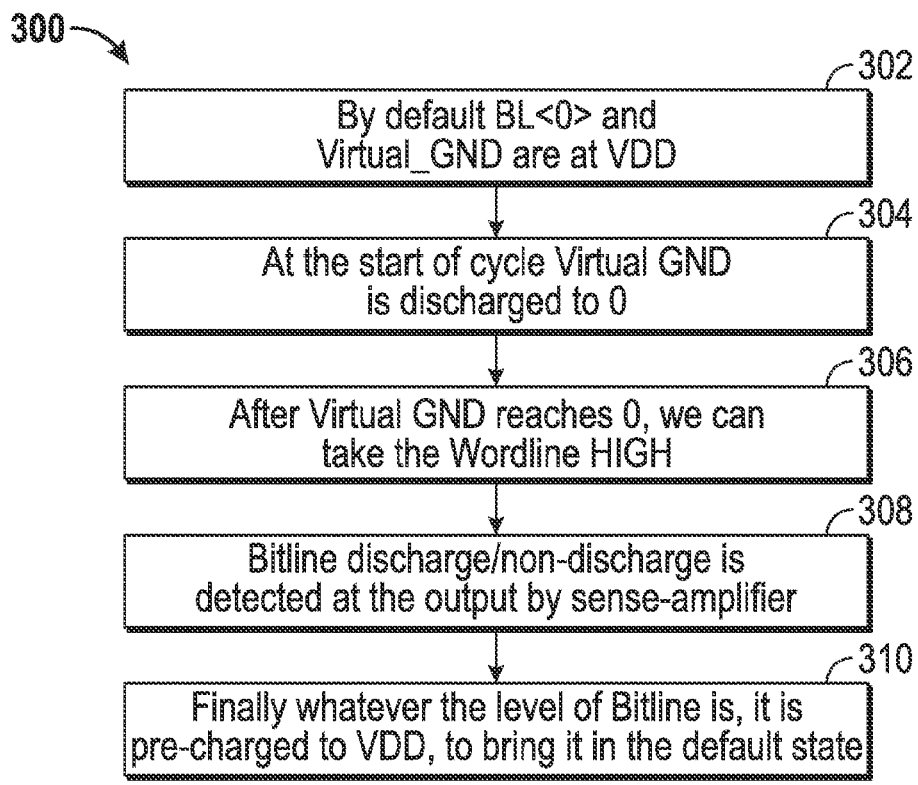
FIG. 5 illustrates a high-level flow chart of operations depicting logical operational of a method for a high-speed and low leakage ROM configuration with virtual ground, in accordance with the disclosed embodiments.

FIG. 5 illustrates a high-level flow chart of operations depicting logical operational steps of a method 300 for a medium area, high-speed, and low leakage ROM configuration with virtual ground, in accordance with the disclosed embodiments. Note that the method 300 shown in FIG. 5 can apply to, for example, the preferred embodiment shown in FIG. 2 and the alternative embodiment depicted in FIG. 4. As shown at block 302, by default BL <0> and Virtual_GND are at VDD. Thus, zero leakage is present during this step. Thereafter, as illustrated at block 304, at the start of the cycle, the virtual GND is discharged to 0. Then, as described at block 306, after virtual GND reaches 0, the word-line can be taken to HIGH. Note that even if this criterion is not met, this will only give minimal penalty in timing, and thus no functionality failures will occur. Thereafter, as illustrated at block 308, bit-line discharge/non-discharge can be detected at the sense-amplifier. Finally, as shown at block 310, whatever level the bit-line is, it is discharged to VDD to bring it to the default state.

Based on the foregoing, it can be appreciated that a number of embodiments, preferred and alternative, are disclosed herein including apparatus and method embodiments thereof. For example, in one embodiment, a read only memory (ROM) having high operational speed with reduced leakage, no core cell standby leakage, and low power consumption can be implemented. Such a ROM may include, for example, one or more bit lines, one or more word lines, one or more virtual grounds, and one or more ROM cells having a source operative coupled to the bit line(s), the word line(s), and the virtual ground(s). The virtual ground can be pulled down to a ground voltage and with respect to non-selected columns, and the virtual ground(s) can be maintained at a supply voltage to ensure that unwanted columns do not offer sub-threshold currents.

In another embodiment the virtual ground(s) can additionally function as a column select signal. In yet another embodiment, the ROM cell(s) can include, for example, a NMOS transistor. In still another embodiment, the virtual ground(s) of a selected column can be pulled to the ground voltage. In yet another embodiment, pre-charging of the bit line(s) does not interfere with an access time path of the ROM, thereby promoting a high operational speed with reduced leakage and low power consumption thereof. In other embodiments, the NOR ROM can be implemented as a NOR memory cell.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A read only memory (ROM) having high operational speed with reduced leakage, no core cell standby leakage, and low power consumption, said ROM comprising:
   at least one bit line;
   at least one word line;
   at least one virtual ground; and
   at least one ROM cell having a source operative coupled to said at least one bit line, said at least one word line, and said at least one virtual ground line, wherein said at least one virtual ground is pulled down to a ground voltage, and wherein said at least one virtual ground is maintained at a supply voltage with respect to non-selected columns to ensure that the non-selected columns do not offer sub-threshold currents.

2. The ROM of claim 1 wherein said at least one virtual ground additionally functions as a column select signal.

3. The ROM of claim 1 wherein said at least one ROM cell comprises a NMOS transistor.

4. The ROM of claim 2 wherein said at least one virtual ground of a selected column is pulled to said ground voltage.

5. The ROM of claim 1 wherein a pre-charging of said at least one bit line does not interfere with an access time path of said ROM, thereby promoting a high operational speed with reduced leakage and low power consumption thereof.

6. The ROM of claim 1 wherein said ROM comprises a NOR memory cell.

7. The ROM of claim 1 wherein said at least one virtual ground additionally functions as a column select signal and wherein said at least one virtual ground of a selected column is pulled to said ground voltage.

8. The ROM of claim 7 wherein said at least one ROM cell comprises a NMOS transistor.

9. The ROM of claim 7 wherein a pre-charging of said at least one bit line does not come in the access time path to promote a high operational speed with reduced leakage and low power consumption thereof.

10. The ROM of claim 7 wherein said ROM comprises a NOR memory cell.

11. A read only memory (ROM) having high operational speed with reduced leakage, no core cell standby leakage, and low power consumption, said ROM comprising:
   at least one bit line associated with at least one word line;
   at least one virtual ground associated with said at least one bit line and said at least one word line, wherein said at least one virtual ground additionally functions as a column select signal;
   at least one ROM cell having a source operative coupled to said at least one bit line, said at least one word line, and said at least one virtual ground line, wherein said at least one virtual ground is pulled down to a ground voltage, and wherein said at least one virtual ground is maintained at a supply voltage for non-selected columns to ensure that the non-selected columns do not offer sub-threshold currents; and
   wherein a pre-charging of said at least one bit line does not interfere with an access time path of said ROM, thereby promoting a high operational speed with reduced leakage and low power consumption thereof.

12. The ROM of claim 11 wherein a pre-charging of said at least one bit line does not come in the access time path to promote a high operational speed with reduced leakage and low power consumption thereof.

13. The ROM of claim 11 wherein said ROM comprises a NOR memory cell.

14. The ROM of claim 11 wherein said at least one ROM cell comprises a NMOS transistor.

15. The ROM of claim 11 wherein said ROM comprises a NOR Memory cell and said at least one ROM cell comprises a NMOS transistor.

16. The ROM of claim 12 wherein said ROM comprises a NOR Memory cell and said at least one ROM cell comprises a NMOS transistor.

17. A read only memory (ROM) method having high operational speed with reduced leakage, no core cell standby leakage, and low power consumption, said method comprising:
   associating at least one bit line with at least one word line and at least one virtual ground;
   configuring at least one ROM cell to include a source operative coupled to said at least one bit line, said at least one word line, and said at least one virtual ground line, wherein said at least one virtual ground is pulled down to a ground voltage; and
   maintaining said at least one virtual ground at a supply voltage for non-selected columns to ensure that the non-selected columns do not offer sub-threshold currents.

18. The method of claim 17 further comprising configuring said at least one virtual ground to functions as a column select signal.

19. The method of claim 17 wherein said at least one virtual ground of a selected column is pulled to said ground voltage.

20. The method of claim 17 a pre-charging of said at least one bit line does not interfere with an access time path of said ROM, thereby promoting a high operational speed with reduced leakage and low power consumption thereof.

* * * * *